United States Patent
Guyette et al.

(10) Patent No.: US 11,888,463 B2
(45) Date of Patent: Jan. 30, 2024

(54) MULTI-PORT FILTER USING TRANSVERSELY-EXCITED FILM BULK ACOUSTIC RESONATORS

(71) Applicant: MURATA MANUFACTURING CO., LTD, Kyoto (JP)

(72) Inventors: Andrew Guyette, Santa Barbara, CA (US); Neal Fenzi, Santa Barbara, CA (US); Patrick Turner, San Bruno, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 636 days.

(21) Appl. No.: 17/094,569

(22) Filed: Nov. 10, 2020

(65) Prior Publication Data
US 2021/0067133 A1 Mar. 4, 2021

Related U.S. Application Data

(63) Continuation-in-part of application No. 16/988,213, filed on Aug. 7, 2020, now Pat. No. 11,201,601,
(Continued)

(51) Int. Cl.
*H03H 9/13* (2006.01)
*H03H 3/02* (2006.01)
(Continued)

(52) U.S. Cl.
CPC .............. *H03H 9/132* (2013.01); *H03H 3/02* (2013.01); *H03H 9/02031* (2013.01);
(Continued)

(58) Field of Classification Search
CPC ...... H03H 9/132; H03H 3/02; H03H 9/02031; H03H 9/02228; H03H 9/174; H03H 9/176;
(Continued)

(56) References Cited

U.S. PATENT DOCUMENTS

| 5,446,330 A | 8/1995 | Eda et al. |
| 5,552,655 A | 9/1996 | Stokes et al. |

(Continued)

FOREIGN PATENT DOCUMENTS

| CN | 113765495 A | 12/2021 |
| JP | H10209804 A | 8/1998 |

(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Hafizur Rahman
(74) *Attorney, Agent, or Firm* — ARENTFOX SCHIFF LLP

(57) ABSTRACT

Filter devices and methods are disclosed. A single-crystal piezoelectric plate is attached to substrate, portions of the piezoelectric plate forming a plurality of diaphragms spanning respective cavities in the substrate. A conductor pattern formed on the piezoelectric plate defines a low band filter including low band shunt resonators and low band series resonators and a high band filter including high band shunt resonators and high band series resonators. Interleaved fingers of interdigital transducers (IDTs) of the low band shunt resonators are disposed on respective diaphragms having a first thickness, interleaved fingers of IDTs of the high band series resonators are disposed on respective diaphragms having a second thickness less than the first thickness, and interleaved fingers of IDTs of the low band series resonators and the high band shunt resonators are disposed on respective diaphragms having thicknesses intermediate the first thickness and the second thickness.

16 Claims, 13 Drawing Sheets

Related U.S. Application Data which is a continuation-in-part of application No. 16/438,121, filed on Jun. 11, 2019, now Pat. No. 10,756,697, which is a continuation-in-part of application No. 16/230,443, filed on Dec. 21, 2018, now Pat. No. 10,491,192.

(60) Provisional application No. 63/040,435, filed on Jun. 17, 2020, provisional application No. 62/904,152, filed on Sep. 23, 2019, provisional application No. 62/892,980, filed on Aug. 28, 2019, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
  *H03H 9/02* (2006.01)
  *H03H 9/17* (2006.01)
  *H03H 9/56* (2006.01)

(52) U.S. Cl.
  CPC ........ *H03H 9/02228* (2013.01); *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01)

(58) Field of Classification Search
  CPC ........ H03H 9/562; H03H 9/564; H03H 9/568; H03H 2003/023
  USPC .......................................................... 333/193
  See application file for complete search history.

(56) References Cited

U.S. PATENT DOCUMENTS

| | | | |
|---|---|---|---|
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,707,229 B1 | 3/2004 | Martin |
| 6,710,514 B2 | 3/2004 | Ikada et al. |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,939,987 B1 | 5/2011 | Solal et al. |
| 7,941,103 B2 | 5/2011 | Iwamoto et al. |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,819,309 B1 | 10/2020 | Turner et al. |
| 10,826,462 B2 | 11/2020 | Plesski et al. |
| 10,868,510 B2 | 12/2020 | Yantchev |
| 10,868,512 B2 | 12/2020 | Garcia et al. |
| 10,917,070 B2 | 2/2021 | Plesski et al. |
| 10,985,728 B2 | 4/2021 | Plesski et al. |
| 11,146,232 B2 | 10/2021 | Yandrapalli et al. |
| 11,201,601 B2 | 12/2021 | Yantchev et al. |
| 11,418,167 B2 | 8/2022 | Garcia |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0099091 A1 | 5/2005 | Mishima et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0131731 A1 | 6/2006 | Sato |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2007/0296304 A1 | 12/2007 | Fujii et al. |
| 2008/0246559 A1 | 10/2008 | Ayazi |
| 2010/0064492 A1 | 3/2010 | Tanaka |
| 2010/0102669 A1 | 4/2010 | Yamanaka |
| 2010/0123367 A1 | 5/2010 | Tai et al. |
| 2010/0212127 A1 | 8/2010 | Heinze et al. |
| 2010/0223999 A1 | 9/2010 | Onoe |
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto |
| 2011/0199163 A1 | 8/2011 | Yamanaka |
| 2011/0278993 A1 | 11/2011 | Iwamoto |
| 2012/0286900 A1 | 11/2012 | Kadota et al. |
| 2013/0057360 A1 | 3/2013 | Meltaus et al. |
| 2013/0207747 A1 | 8/2013 | Nishii et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0244149 A1 | 8/2015 | Van Someren |
| 2015/0319537 A1 | 11/2015 | Perois et al. |
| 2015/0333730 A1 | 11/2015 | Meltaus |
| 2016/0028367 A1 | 1/2016 | Shealy |
| 2016/0036415 A1 | 2/2016 | Ikeuchi |
| 2016/0049920 A1 | 2/2016 | Kishino |

(56) References Cited

U.S. PATENT DOCUMENTS

| | | |
|---|---|---|
| 2016/0079958 A1 | 3/2016 | Burak |
| 2016/0149554 A1 | 5/2016 | Nakagawa |
| 2016/0182009 A1 | 6/2016 | Bhattacharjee |
| 2016/0285430 A1 | 9/2016 | Kikuchi et al. |
| 2017/0063332 A1 | 3/2017 | Gilbert et al. |
| 2017/0179928 A1 | 6/2017 | Raihn et al. |
| 2017/0187352 A1 | 6/2017 | Omura |
| 2017/0201232 A1 | 7/2017 | Nakamura et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0359050 A1 | 12/2017 | Irieda et al. |
| 2017/0370791 A1 | 12/2017 | Nakamura et al. |
| 2018/0005950 A1 | 1/2018 | Watanabe |
| 2018/0013400 A1 | 1/2018 | Ito et al. |
| 2018/0013405 A1 | 1/2018 | Takata |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong |
| 2018/0152169 A1 | 5/2018 | Goto et al. |
| 2018/0191322 A1 | 7/2018 | Chang et al. |
| 2018/0212589 A1 | 7/2018 | Meltaus et al. |
| 2018/0316333 A1 | 11/2018 | Nakamura et al. |
| 2019/0007022 A1 | 1/2019 | Goto et al. |
| 2019/0068155 A1 | 2/2019 | Kimura et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin |
| 2019/0348966 A1 | 11/2019 | Campanella-Pineda |
| 2019/0386638 A1 | 12/2019 | Kimura et al. |
| 2020/0021272 A1 | 1/2020 | Segovia Fernandez et al. |
| 2020/0036357 A1 | 1/2020 | Mimura |
| 2020/0228087 A1 | 7/2020 | Michigami et al. |
| 2020/0235719 A1 | 7/2020 | Yantchev et al. |
| 2020/0295729 A1 | 9/2020 | Yantchev |
| 2020/0304091 A1 | 9/2020 | Yantchev |
| 2020/0321939 A1 | 10/2020 | Turner et al. |
| 2020/0328728 A1 | 10/2020 | Nakagawa et al. |
| 2021/0273631 A1 | 9/2021 | Jachowski et al. |
| 2021/0313951 A1 | 10/2021 | Yandrapalli et al. |
| 2021/0328575 A1 | 10/2021 | Hammond et al. |
| 2022/0103160 A1 | 3/2022 | Jachowski et al. |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010062816 A | 3/2010 |
| JP | 2010103803 A | 5/2010 |
| JP | 2010233210 A | 10/2010 |
| JP | 2013528996 A | 7/2013 |
| JP | 2013214954 A | 10/2013 |
| JP | 2015054986 A | 3/2015 |
| JP | 2016001923 A | 1/2016 |
| JP | 2017526254 A | 9/2017 |
| JP | 2017220910 A | 12/2017 |
| JP | 2018093487 A | 6/2018 |
| JP | 2018166259 A | 10/2018 |
| JP | 2018207144 A | 12/2018 |
| JP | 2019186655 A | 10/2019 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2017188342 A1 | 11/2017 |
| WO | 2018003273 A1 | 1/2018 |
| WO | 2018163860 A1 | 9/2018 |
| WO | 2019138810 A1 | 7/2019 |
| WO | 2020092414 A2 | 5/2020 |
| WO | 2020100744 A1 | 5/2020 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate Mems Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

USPTO/ISA, International Search Report and Written Opinion for PCT Application No. PCT/US2020/45654 dated Oct. 29, 2020.

Buchanan "Ceramit Materials for Electronics" 3rd Edition, first published in 2004 by Marcel Dekker, Inc. pp. 496 (Year 2004). Jan. 2004.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.

Zou, Jie "High-Performance Aluminum Nitride Lamb Wave Resonators for RF Front-End Technology" University of California, Berkeley, Summer 2015, pp. 63 (Year 2015) Jan. 2015.

Santosh, G., Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Safari et al. "Piezoelectric for Transducer Applications" published by Elsevier Science Ltd., pp. 4 (Year: 2000). 2020.

(56) References Cited

OTHER PUBLICATIONS

Moussa et al. Review on Triggered Liposomal Drug Delivery with a Focus on Ultrasound 2015, Bentham Science Publishers, pp. 16 (Year 2005) 2005.

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Material Properties of Tibtech Innovations, © 2018 Tibtech Innovations (Year 2018). 2018.

Namdeo et al. "Simulation on Effects of Electrical Loading due to Interdigital Transducers in Surface Acoustic Wave Resonator", published in Procedia Engineering 64 (2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Webster Dictionary, Meaning of "diaphragm" Merriam Webster since 1828. 1828.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Chen et al., "Development and Application of SAW Filter," Micromachines, Apr. 20, 2022, vol. 13, No. 656, pp. 1-15.

Hermann et al., "Properties of shear-horizontal surface acoustic waves in different layered quartz-SiO2 structures," Ultrasonics, 1999, vol. 37, pp. 335-341.

International Search Report and Written Opinion in PCT/US2022/081068, dated Apr. 18, 2023, 17 pages.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

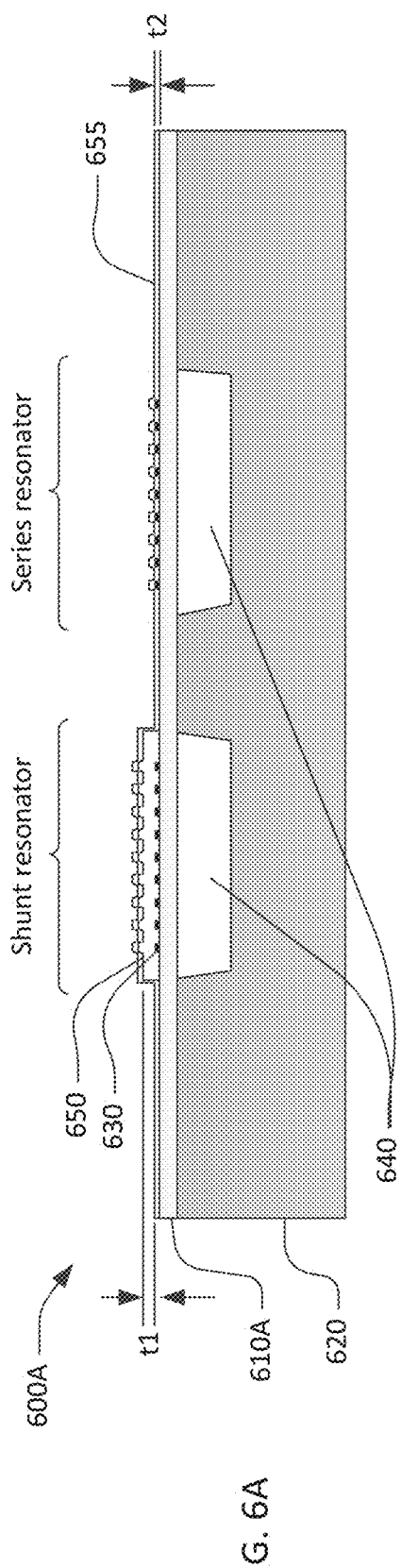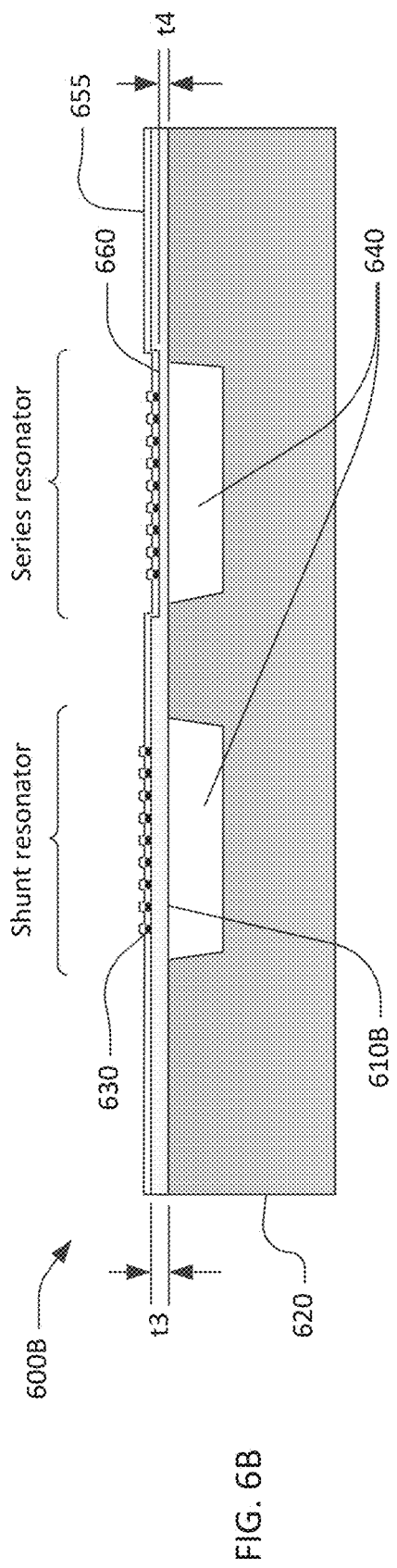

MULTI-PORT FILTER USING TRANSVERSELY-EXCITED FILM BULK ACOUSTIC RESONATORS

RELATED APPLICATION INFORMATION

The patent claims priority to the following provisional patent applications: application 63/040,435, titled MONOLITHIC MULTI-PORT XBAR, filed Jun. 17, 2020.

This patent is a continuation in part of application Ser. No. 16/988,213, filed Aug. 7, 2020, entitled TRANSVERSELY-EXCITED FILM BULK ACOUSTIC RESONATORS WITH MULTIPLE DIAPHRAGM THICKNESSES AND FABRICATION METHOD, which claims priority to the following provisional patent applications: application 62/892,980, titled XBAR FABRICATION, filed Aug. 28, 2019; and application 62/904,152, titled DIELECTRIC OVERLAYER TRIMMING FOR FREQUENCY CONTROL, filed Sep. 23, 2019. Application Ser. No. 16/988,213 is a continuation in part of application Ser. No. 16/438,121, filed Jun. 11, 2019, entitled TRANSVERSELY-EXCITED FILM BULK ACOUSTIC RESONATOR, now U.S. Pat. No. 10,756,697, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

DESCRIPTION OF THE DRAWINGS

FIG. 6A is a schematic cross-sectional view of a filter with a dielectric layer to set a frequency separation between shunt resonators and series resonators.

FIG. 6B is a schematic cross-sectional view of a filter with different piezoelectric diaphragm thicknesses to set a frequency separation between shunt resonators and series resonators.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
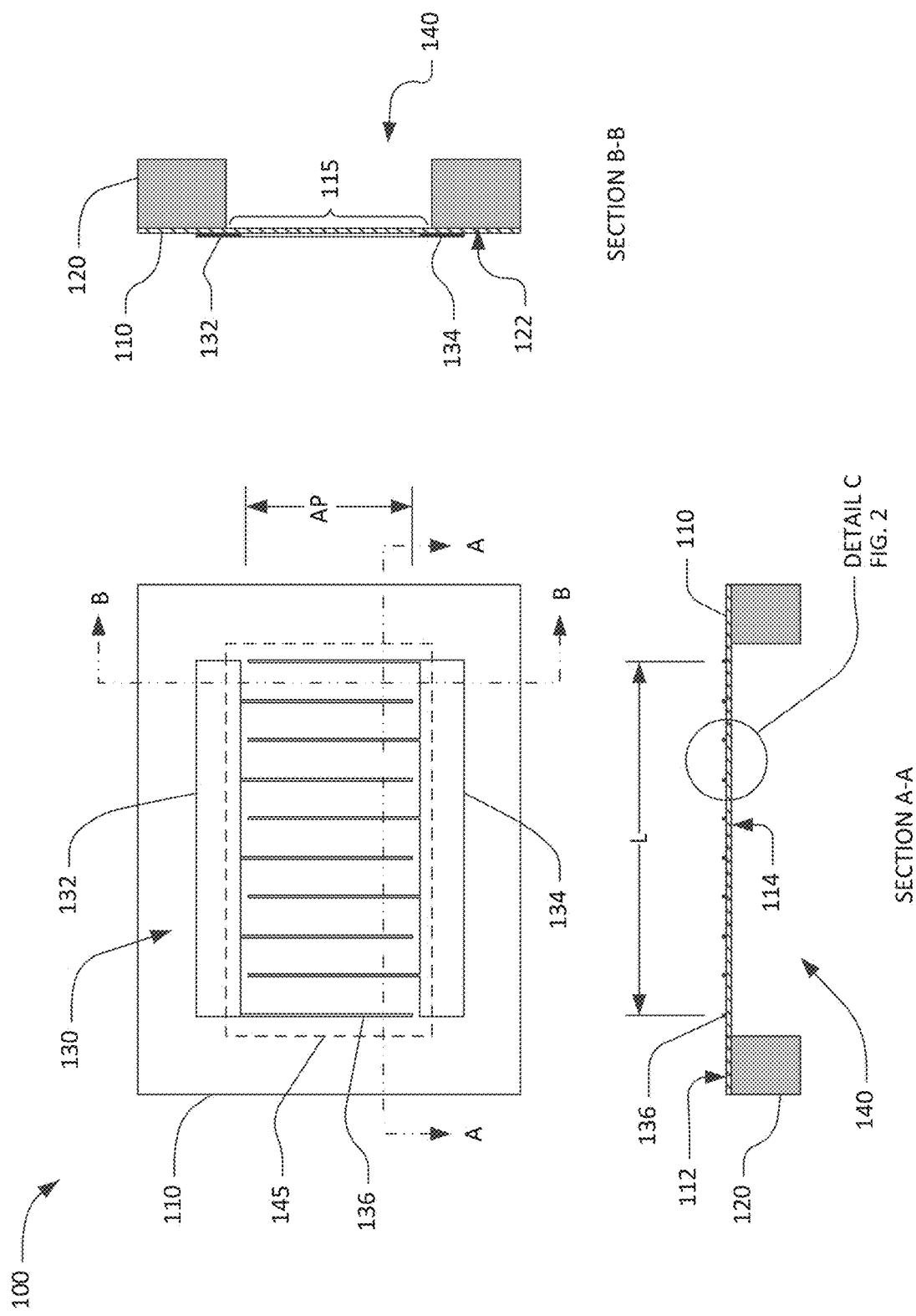
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, diplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate, or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120. "Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
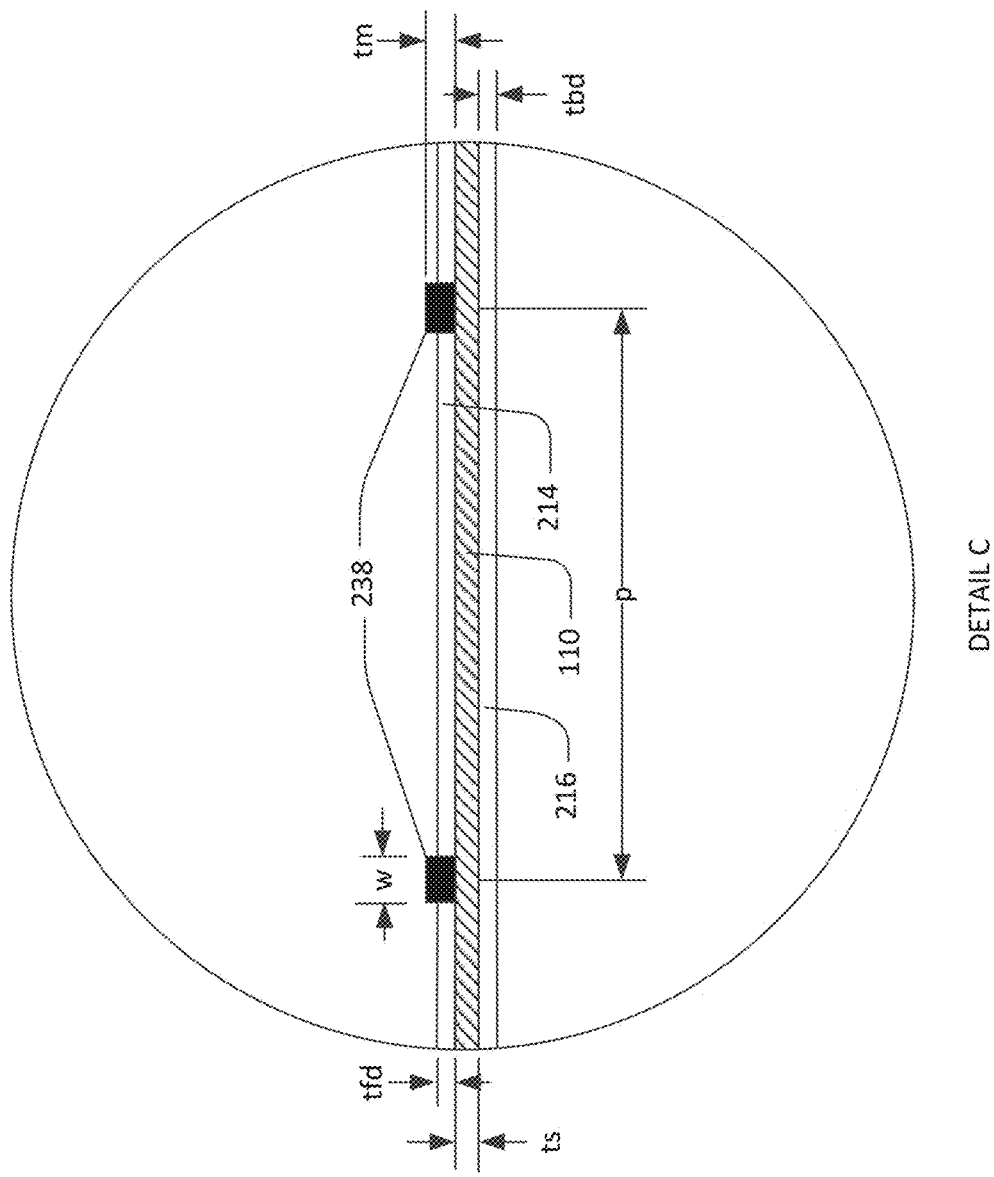
FIG. 2 is an expanded schematic cross-sectional view of a portion of the XBAR of FIG. 1.

FIG. 2 shows a detailed schematic cross-sectional view of the XBAR 100 of FIG. 1. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum or a substantially aluminum alloy, copper or a substantially copper alloy, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
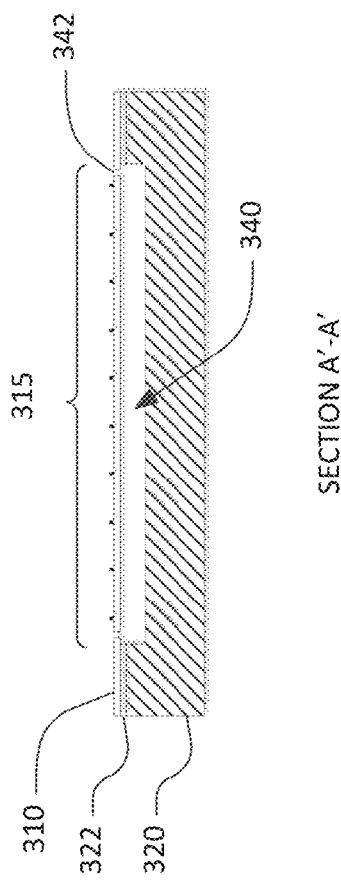
FIG. 3 is an alternative schematic cross-sectional view of the XBAR of FIG. 1.

FIG. 3 is an alternative cross-sectional view along the section plane A-A defined in FIG. 1. In FIG. 3, a piezoelectric plate 310 is attached to a substrate 320. An optional dielectric layer 322 may be sandwiched between the piezoelectric plate 310 and the substrate 320. A cavity 340, which does not fully penetrate the substrate 320, is formed in the substrate under the portion of the piezoelectric plate 310 containing the IDT of an XBAR. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310.

The XBAR 300 shown in FIG. 3 will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110.

Figure 4:
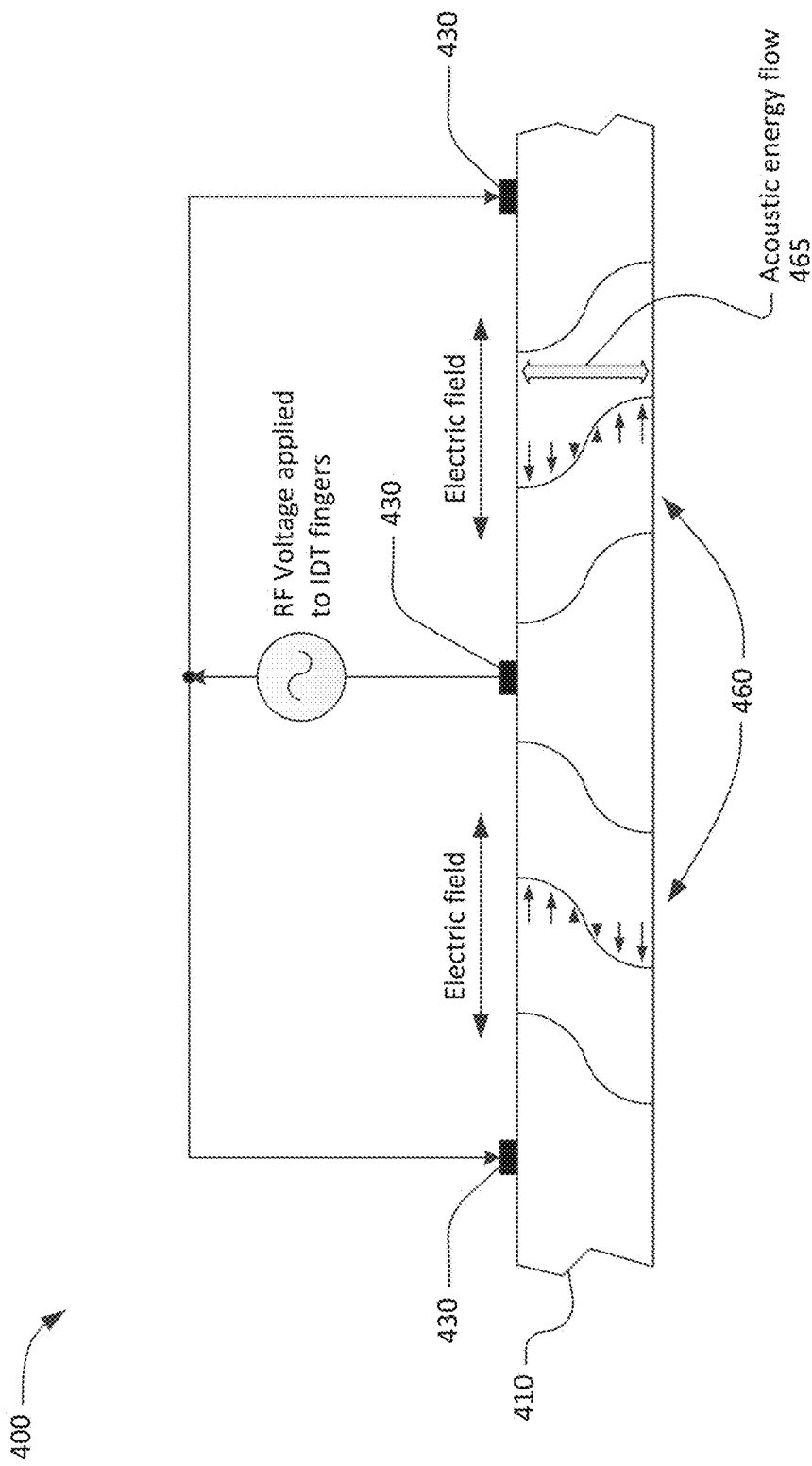
FIG. 4 is a graphic illustrating a shear acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites a shear-mode acoustic mode, in the piezoelectric plate 410. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

Considering FIG. 4, there is essentially no electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the IDT fingers 430 is low (for example compared to the fingers of an IDT in a SAW resonator), which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5:
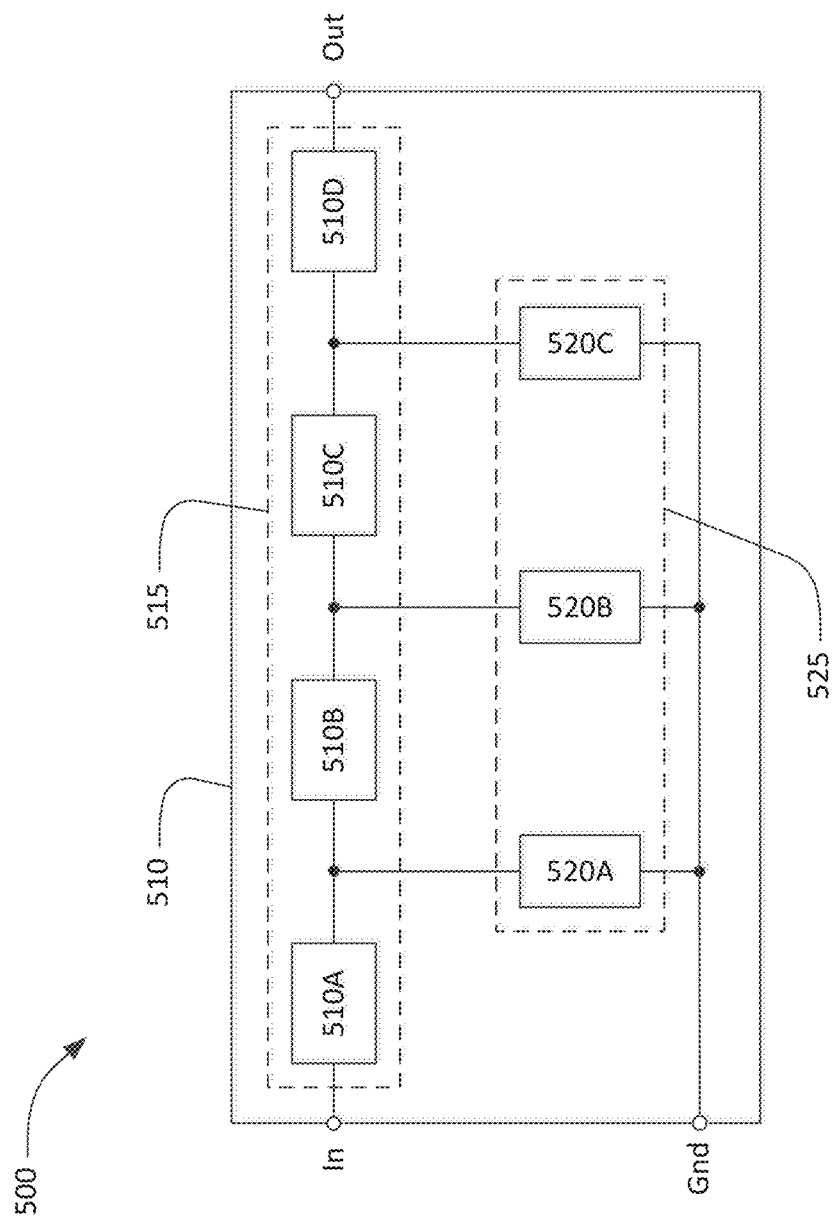
FIG. 5 is a schematic block diagram of a bandpass filter incorporating seven XBARs.

FIG. 5 is a schematic circuit diagram for a high frequency band-pass filter 500 using XBARs. The filter 500 has a conventional ladder filter architecture including four series resonators 510A, 510B, 510C, 510D and three shunt resonators 520A, 520B, 520C. The four series resonators 510A, 510B, 510C, and 510D are connected in series between a first port and a second port. In FIG. 5, the first and second ports are labeled "In" and "Out", respectively. However, the filter 500 is symmetrical and either port and serve as the input or output of the filter. The three shunt resonators 520A, 520B, 520C are connected from nodes between the series resonators to ground. All the shunt resonators and series resonators are XBARs. Although not shown in FIG. 5, any and all of the resonators may be divided into multiple sub-resonators electrically connected in parallel. Each sub-resonator may have a respective diaphragm.

The filter 500 may include a substrate having a surface, a single-crystal piezoelectric plate having parallel front and back surfaces, and an acoustic Bragg reflector sandwiched between the surface of the substrate and the back surface of the single-crystal piezoelectric plate. The substrate, acoustic Bragg reflector, and piezoelectric plate are represented by the rectangle 510 in FIG. 5. A conductor pattern formed on the front surface of the single-crystal piezoelectric plate includes interdigital transducers (IDTs) for each of the four series resonators 510A, 510B, 510C, 510D and three shunt resonators 520A, 520B, 520C. All of the IDTs are configured to excite shear acoustic waves in the single-crystal piezoelectric plate in response to respective radio frequency signals applied to each IDT.

In a ladder filter, such as the filter 500, the resonance frequencies of shunt resonators are typically lower than the resonance frequencies of series resonators. The resonance frequency of an SM XBAR resonator is determined, in part, by IDT pitch. IDT pitch also impacts other filter parameters including impedance and power handling capability. For broad-band filter applications, it may not be practical to provide the required difference between the resonance frequencies of shunt and series resonators using only differences in IDT pitch.

As described in U.S. Pat. No. 10,601,392, a first dielectric layer (represented by the dashed rectangle 525) having a first thickness t1 may be deposited over the IDTs of some or all of the shunt resonators 520A, 520B, 520C. A second dielectric layer (represented by the dashed rectangle 515) having a second thickness t2, less than t1, may be deposited over the IDTs of the series resonators 510A, 510B, 510C, 510D. The second dielectric layer may be deposited over both the shunt and series resonators. The difference between the thickness t1 and the thickness t2 defines a frequency offset between the series and shunt resonators. Individual series or shunt resonators may be tuned to different frequencies by varying the pitch of the respective IDTs. In some filters, more than two dielectric layers of different thicknesses may be used as described in co-pending application Ser. No. 16/924,108.

Alternatively or additionally, the shunt resonators 510A, 510B, 510C, 510D may be formed on a piezoelectric plate having a thickness t3 and the series resonators may be fabricated on a piezoelectric plate having a thickness t4 less than t3. The difference between the thicknesses t3 and t4 defines a frequency offset between the series and shunt resonators. Individual series or shunt resonators may be tuned to different frequencies by varying the pitch of the respective IDTs. In some filters, three or more different piezoelectric plate thicknesses may be used to provide additional frequency tuning capability.

FIG. 6A is a schematic cross-sectional view though a shunt resonator and a series resonator of a filter 600A that uses dielectric thickness to separate the frequencies of shunt and series resonators. A piezoelectric plate 610A is attached to a substrate 620. Portions of the piezoelectric plate form diaphragms spanning cavities 640 in the substrate 620. Interleaved IDT fingers, such as finger 630, are formed on the diaphragms. A first dielectric layer 650, having a thickness t1, is formed over the IDT of the shunt resonator. A second dielectric layer 655, having a thickness t2, is deposited over both the shunt and series resonator. Alternatively, a single dielectric layer having thickness t1+t2 may be deposited over both the shunt and series resonators. The dielectric layer over the series resonator may then be thinned to thickness t2 using a masked dry etching process. In either case, the difference between the overall thickness of the dielectric layers (t1+t2) over the shunt resonator and the thickness t2 of the second dielectric layer defines a frequency offset between the series and shunt resonators.

The second dielectric layer 655 may also serve to seal and passivate the surface of the filter 600A. The second dielectric layer may be the same material as the first dielectric layer or a different material. The second dielectric layer may be a laminate of two or more sub-layers of different materials. Alternatively, an additional dielectric passivation layer (not shown in FIG. 6A) may be formed over the surface of the filter 600A. Further, as will be described subsequently, the thickness of the final dielectric layer (i.e. either the second dielectric layer 655 or an additional dielectric layer) may be locally adjusted to fine-tune the frequency of the filter 600A. Thus, the final dielectric layer can be referred to as the "passivation and tuning layer".

FIG. 6B is a schematic cross-sectional view though a shunt resonator and a series resonator of a filter 600B that uses piezoelectric plate thickness to separate the frequencies of shunt and series resonators. A piezoelectric plate 610B is attached to a substrate 620. Portions of the piezoelectric plate form diaphragms spanning cavities 640 in the substrate 620. Interleaved IDT fingers, such as finger 630, are formed on the diaphragms. The diaphragm of the shunt resonator has a thickness t3. The piezoelectric plate 610B is selectively thinned such that the diaphragm of the series resonator has a thickness t4, which is less than t3. The difference between t3 and t4 defines a frequency offset between the series and shunt resonators. A passivation and tuning layer 655 is deposited over both the shunt and series resonators.

Figure 7A:
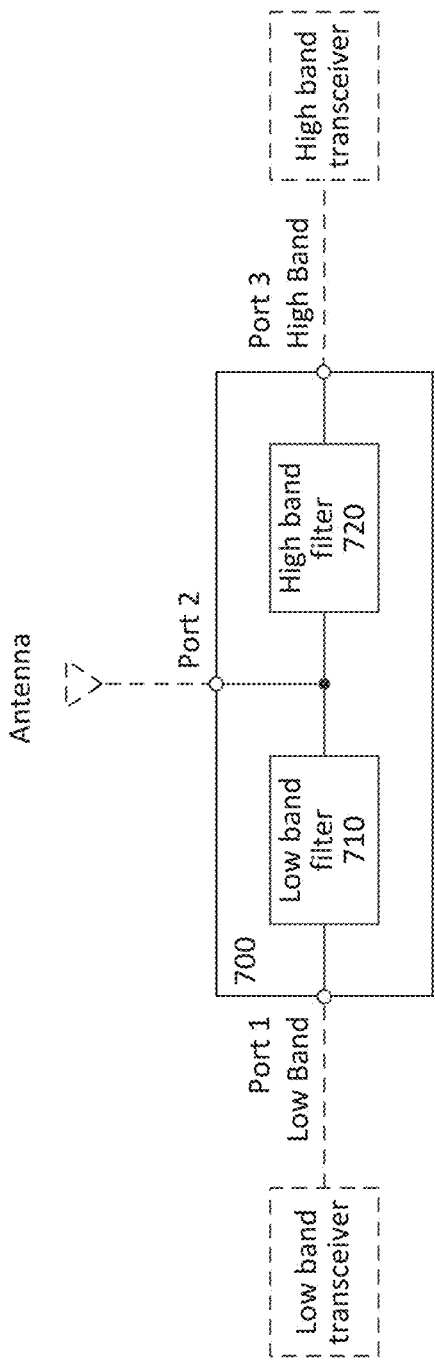
FIG. 7A is a schematic block diagram of a diplexer including two bandpass filters.

FIG. 7A is a schematic block diagram of an exemplary multi-port filter. This example is a diplexer 700, or two-channel multiplexer, for separating and/or combining radio frequency signals in two different frequency bands. A diplexer, such as the diplexer 700, may be used, for example, to connect a low band transceiver and a high band transceiver to a common antenna as shown in FIG. 7. The transceivers and antenna are not part of the diplexer 700.

The diplexer 700 includes a low band filter 710 and a high band filter 720. The low band filter 710 has a passband that is lower in frequency and does not overlap a passband of the high band filter 720. Both the low band filter 710 and the high band filter 720 may be implemented using XBARs connected in ladder filter circuits as shown in FIG. 5.

Figure 7B:
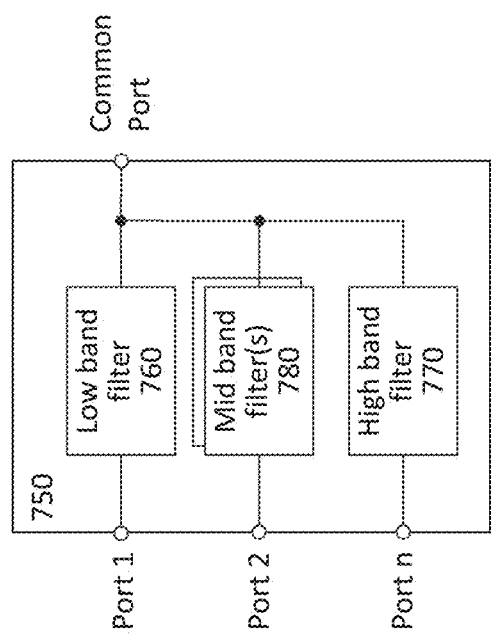
FIG. 7B is a schematic block diagram of a multiplexer including three bandpass filters.

FIG. 7B is a schematic block diagram of another exemplary multi-port filter. This example is a multiplexer 750, for separating and/or combining radio frequency signals in multiple different frequency bands.

The multiplexer 750 includes a low band filter 760, a high band filter 770, and one or more mid band filter 780. In this context, "high" and "low" are relative terms. The high band filter 770 has the highest frequency passband of any of the filters in the multiplexer. Similarly, the low band filter 760 has the lowest frequency passband of any of the filters in the multiplexer. The one or more mid band filters 780 have pass band intermediate the passbands of the high and low band filters. The passbands of the filters do not overlap in frequency. The low band filter 760, the high band filter 770, and the one or more mid band filters 780 may be implemented using XBARs connected in ladder filter circuits as shown in FIG. 5.

Figure 8:
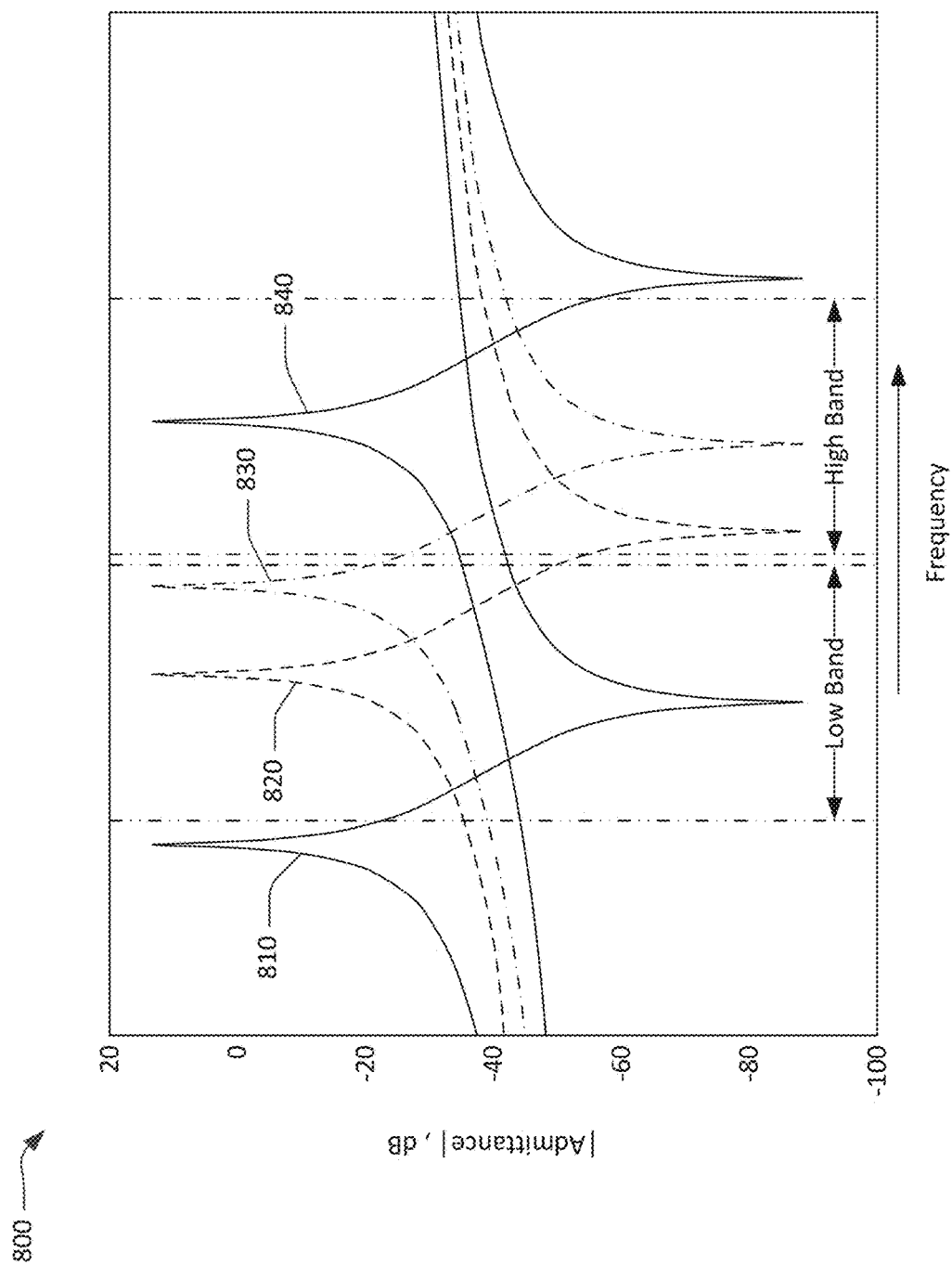
FIG. 8 is a graph of the admittance of four XBARs for use in the diplexer of FIG. 7A.

FIG. 8 is a graph of the admittance of four representative XBARs suitable for use in a diplexer such as the diplexer 700 of FIG. 7. FIG. 8 assumes the low band and high band are nearly adjacent, with a small frequency difference between the upper band edge of the low band and the low band edge of the high band. Diplexers with nearly adjacent bands may be required when two transceivers are connected to a common antenna. Each of the four XBARs has a resonance frequency where its admittance is maximum and an anti-resonance frequency where its admittance is minimum.

The solid curve 810 is a plot of the magnitude of admittance versus frequency for a shunt resonator in the low band filter of the diplexer. The resonance frequency of this shunt resonator is just below the lower edge of the low band. The dashed curve 820 is a plot of the magnitude of admittance versus frequency for a series resonator in the low band filter of the diplexer. The resonance frequency of this series resonator is just above the upper edge of the low band.

The dash-dot curve 830 is a plot of the magnitude of admittance versus frequency for a shunt resonator in the high band filter of the diplexer. The resonance frequency of this shunt resonator is just below the lower edge of the high band. The solid curve 840 is a plot of the magnitude of admittance versus frequency for a series resonator in the high band filter of the diplexer. The resonance frequency of this series resonator is just above the upper edge of the high band.

Depending on the frequencies of the low band and the high band, it may not be possible to fabricate the shunt and series XBARs of both the high and low band filters on a single piezoelectric plate thickness. For example, consider a diplexer for 5G NR (5$^{th}$ generation new radio) bands n77 (3300 MHz to 4200 MHz) and n79 (4400 MHz to 5000 MHz). The difference between the resonance frequency of the low band shunt resonator (curve 810) and the anti-resonance frequency of the high band series resonator (curve 840) is about 2 GHz. This frequency difference cannot be achieved on a single diaphragm thickness and is difficult to achieve with only two diaphragm thicknesses.

Figure 9:
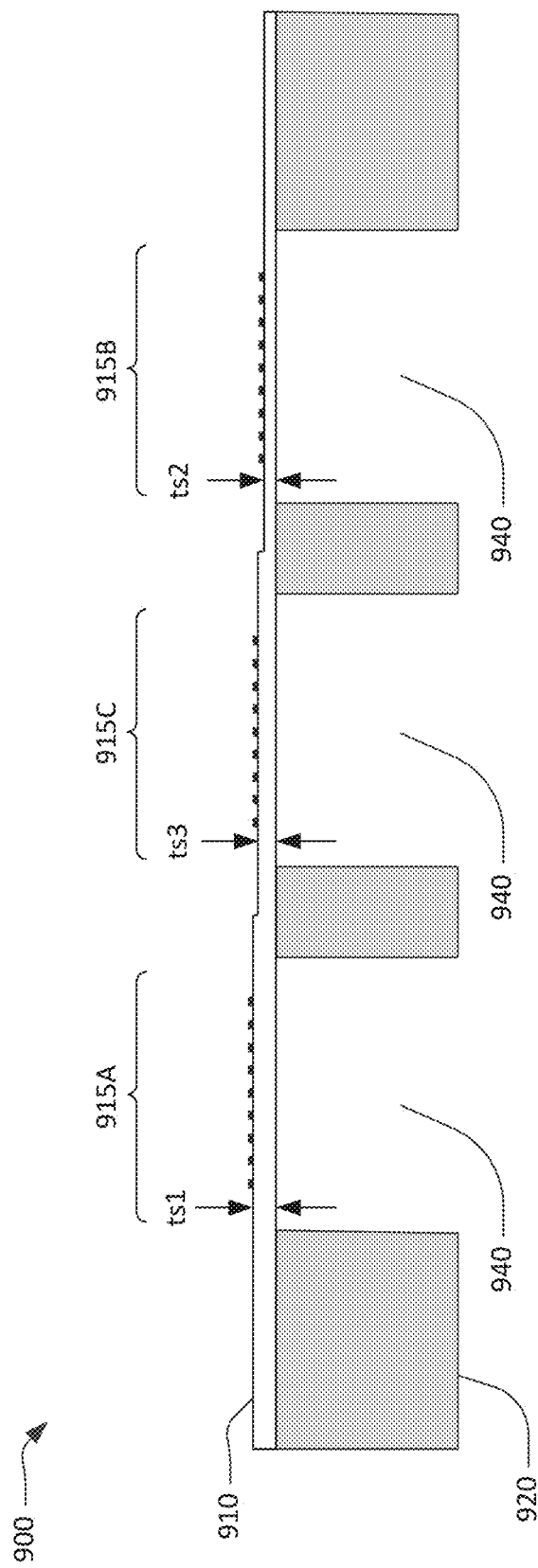
FIG. 9 is a schematic cross-sectional view of a filter with three different piezoelectric diaphragm thicknesses.

FIG. 9 is a schematic cross-sectional view of a portion of an XBAR filter 900 with three different piezoelectric diaphragm thicknesses. The filter 900 includes a piezoelectric plate 910 supported by a substrate 920. Three portions of the piezoelectric plate 910 form diaphragms 915A, 915B, 915C spanning cavities 940 is the substrate 920. Interleaved fingers of IDT (not identified) are formed on each diaphragm. Diaphragm 915A has a first thickness ts1 equal to the original thickness of the piezoelectric plate 910. Diaphragm 915A is the thickest of the three diaphragms. Diaphragm 915B has a second thickness ts2. Diaphragm 915B is the thinnest of the three diaphragms. Diaphragm 915C has a third thickness ts3 which is intermediate ts1 and ts2. Diaphragms 915B and 915C are areas where the piezoelectric plate was thinned by selectively removing material from the surface of the plate. Processes for forming multiple piezoelectric plate thicknesses which be described subsequently.

While FIG. 9 illustrates a filter using three diaphragm thicknesses, more than three diaphragm thicknesses are possible. By definition, the first diaphragm thickness ts1 is the thickest and the second diaphragm thickness is the thinnest. Other diaphragm thicknesses will be intermediate the first and second thickness, which is to say less than the first thickness and greater than the second thickness.

Figure 10:
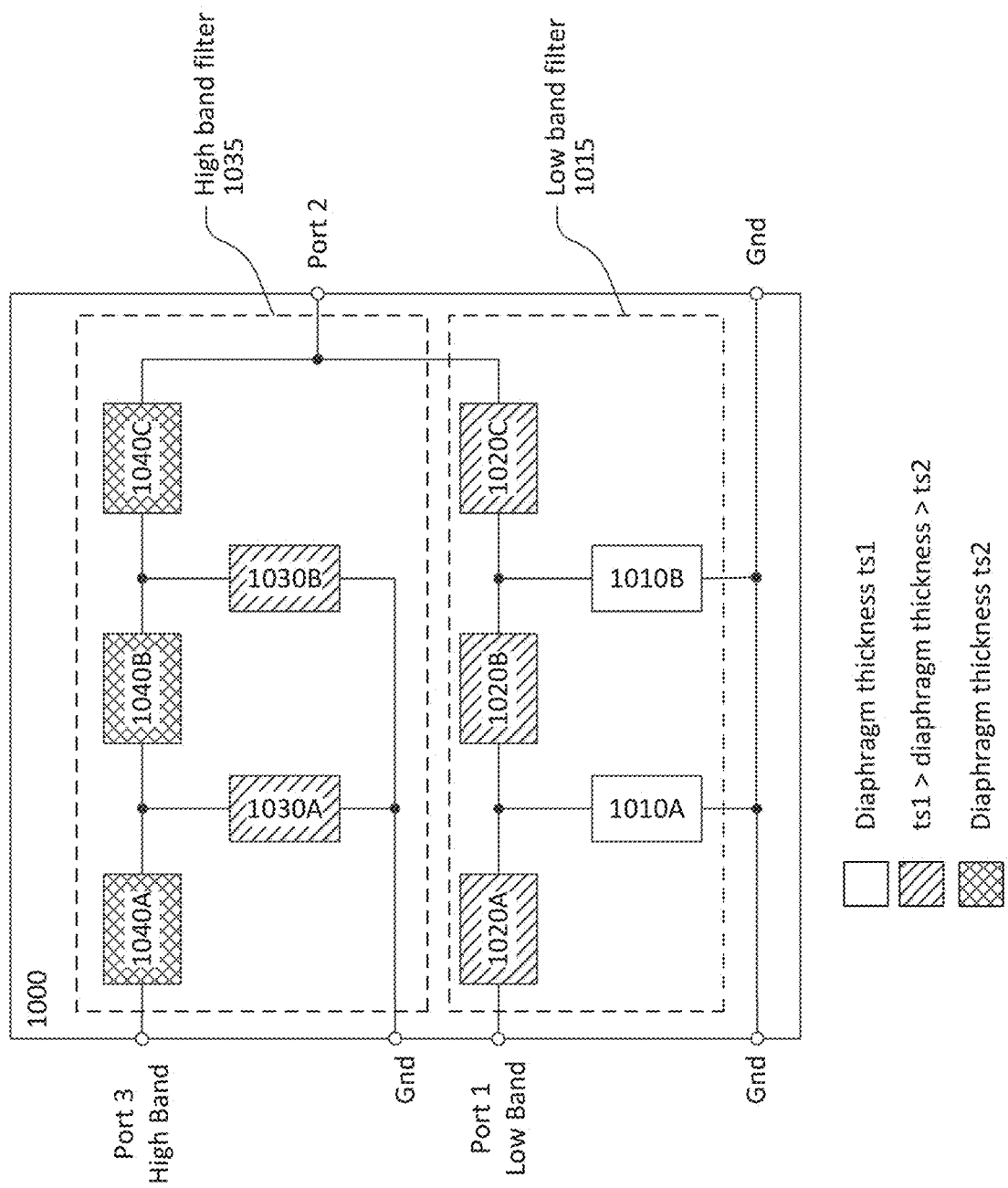
FIG. 10 is a more detailed schematic block diagram of a diplexer including two bandpass filters.

FIG. 10 is a schematic block diagram of a diplexer 1000, which may be the diplexer 700 of FIG. 7A. Within the diplexer 1000, a low band filter 1015 includes shunt resonators 1010A, 1010B and series resonators 1020A, 1020B, 1020C connected in a ladder filter circuit. A high band filter 1035 includes shunt resonators 1030A, 1030B and series resonators 1040A, 1040B, 1040C connected in a ladder filter circuit. For example, the low band filter 1015 may be a band n77 bandpass filter and the high band filter 1035 may be a band n79 bandpass filter.

The use of two shunt resonators and three series resonators for each of low and high band filters is exemplary. Either filter may have more or fewer than two shunt resonators, more or fewer than three series resonators, and more or fewer than five total resonators. Port 1 connects to the low band filter 1015, port 3 connects to the high band filter 1035, and port 2 is the common port.

The diplexer 1000 is implemented with XBARs with three or more different diaphragm thicknesses similar to the filter 900 shown in FIG. 9. The low band shunt resonators (i.e. the shunt resonators of the low band filter 1015) 1010A and 1010B have a first diaphragm thickness ts1. The high band series resonators have a second diaphragm thickness ts2, which is less than ts1. The other resonators (low band series resonators and high band shunt resonators) have diaphragm thicknesses intermediate ts1 and ts2. Referring back to FIG. 8, the resonant frequencies of the low band series resonators and the high band shunt resonators may be relatively close such that all of these resonators may have a common third diaphragm thickness ts3.

Figure 11:
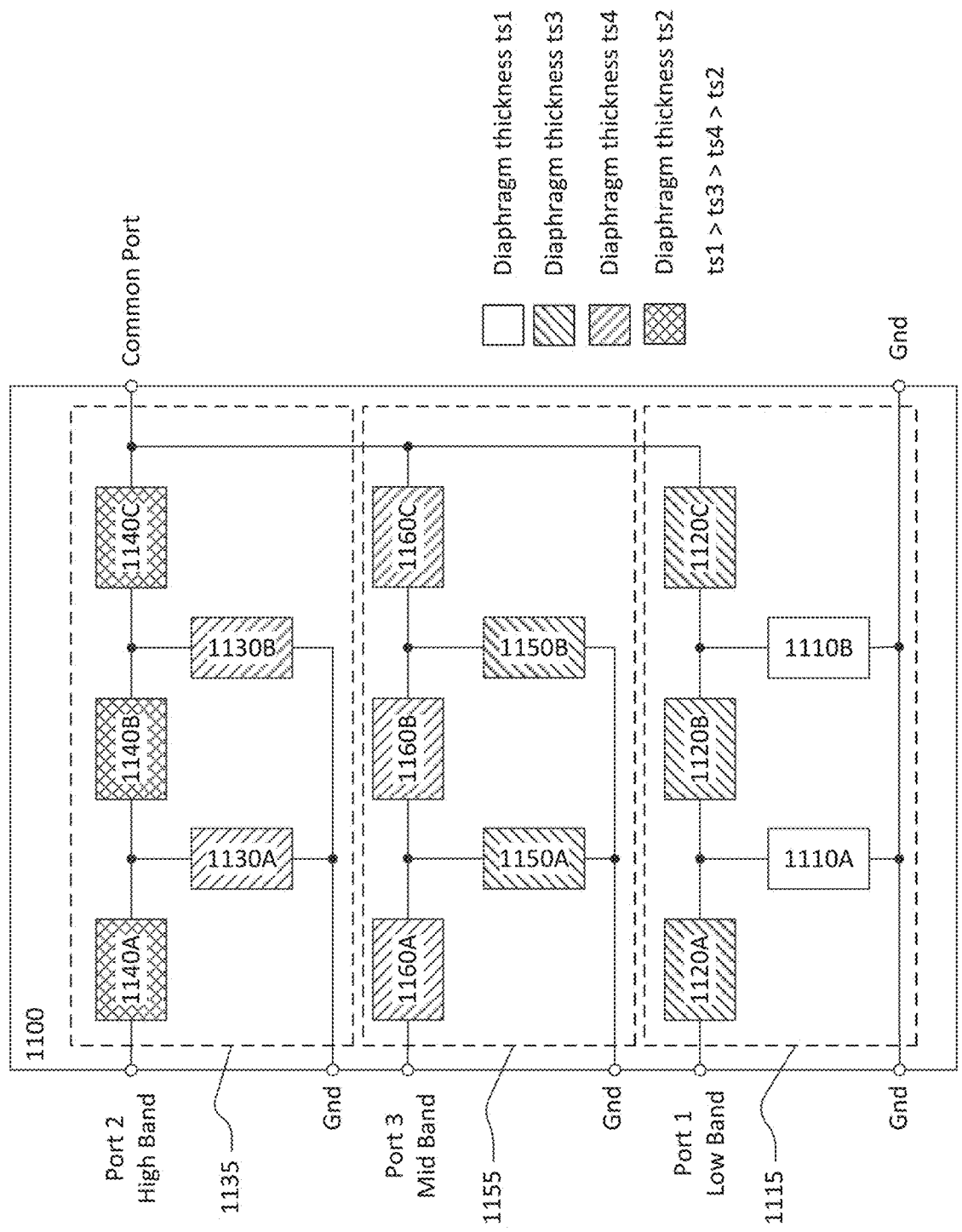
FIG. 11 is a more detailed schematic block diagram of a multiplexer including three bandpass filters.

FIG. 11 is a schematic block diagram of a multiplexer 1100, which may be the multiplexer 750 of FIG. 7B. Within the multiplexer 1100, a low band filter 1115 includes shunt resonators 1110A, 1110B and series resonators 1120A, 1120B, 1120C connected in a ladder filter circuit. A high band filter 1135 includes shunt resonators 1130A, 1130B and series resonators 1140A, 1140B, 1140C connected in a ladder filter circuit. A mid band filter 1155 includes shunt resonators 1150A, 1150B and series resonators 1160A, 1160B, 1160C connected in a ladder filter circuit.

The use of two shunt resonators and three series resonators for each of low, mid, and high band filters is exemplary. Each filter may have more or fewer than two shunt resonators, more or fewer than three series resonators, and more or fewer than five total resonators. Port 1 connects to the low band filter 1015, port 2 connects to the high band filter 1035, and port 3 connects to the mid band filter. All three filters connect to the common port.

The multiplexer 1100 is implemented with XBARs with three or more different diaphragm thicknesses similar to the filter 900 shown in FIG. 9. The low band shunt resonators (i.e. the shunt resonators of the low band filter 1115) 1110A and 1110B have a first diaphragm thickness ts1. The high band series resonators 1140A, 1140B, 1140C have a second diaphragm thickness ts2, which is less than ts1. The other resonators (low band series resonators, all mid band resonators, and high band shunt resonators) have diaphragm thicknesses intermediate ts1 and ts2. For example, the low band series 1120A, 1120B, 1120C resonators and the mid band shunt resonators 1150A, 1150B may have diaphragm thickness ts3 and the mid band series resonators 1160A, 1160B, 1160C and the high band shunt resonators 1130A, 1130B may have diaphragm thickness ts4. In this case ts1>ts3>ts4>ts2.

Description of Methods

Figure 12:
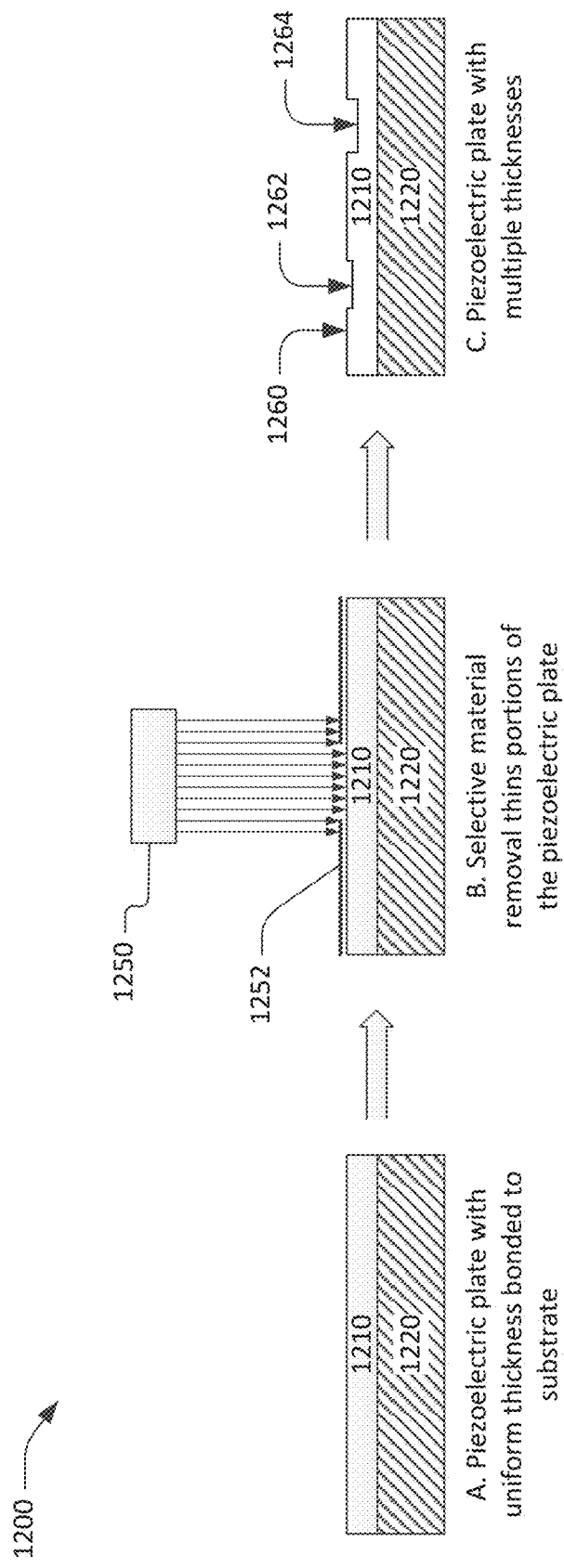
FIG. 12 is a sequence of cross-sectional views illustrating a process for forming a piezoelectric plate with multiple thicknesses.

FIG. 12 is a series of schematic cross-section views illustrating a process 1200 to form different thickness areas of a piezoelectric plate. View A shows a piezoelectric plate 1210 with uniform thickness bonded to a substrate 1220. The piezoelectric plate 1210 may be, for example, lithium niobate or lithium tantalate. The substrate 1220 may be a silicon wafer or some other material as previously described.

View B illustrates selective removal to thin selected portions of the piezoelectric plate. Selected portions of the piezoelectric plate may be thinned, for example, to provide diaphragms for series resonators as previously shown in FIG. 6B. Selected portions of the piezoelectric plate may be thinned using a scanning ion mill or other scanning material removal tool if the tool has sufficient spatial resolution to distinguish the areas of the piezoelectric plate to be thinned. Alternatively, a scanning or non-scanning material removal tool 1250 may be used to remove material from portions of the surface of the piezoelectric plate defined by a mask 1252. The material removal tool may be, for example, a tool employing Fluorine-based reactive ion etching, a sputter etching tool, or some other dry etching tool. Alternatively, a wet etch may be used to selectively remove material from areas defined by the mask 1252. When more than two different diaphragm thickness are required, multiple material operations with different masks may be performed.

View C illustrates a piezoelectric plate 1210 with three different thicknesses bonded to a substrate 1220. The piezoelectric plate 1210 has an original surface 1260 and two recesses 1262, 1264 with different thicknesses formed by removing material as shown in view B. The process 1200 may be used to form areas on the piezoelectric plate with more than three different thicknesses. Cavities may then be formed under portions of these areas to provide diaphragms with three different thicknesses. The process 1200 is exemplary and other different processes and methods may be used to create multiple thickness regions on a piezoelectric plate. The process 1200 is not limited to three different thicknesses and may be used to create piezoelectric plates with areas having four or more different thicknesses.

Figure 13:
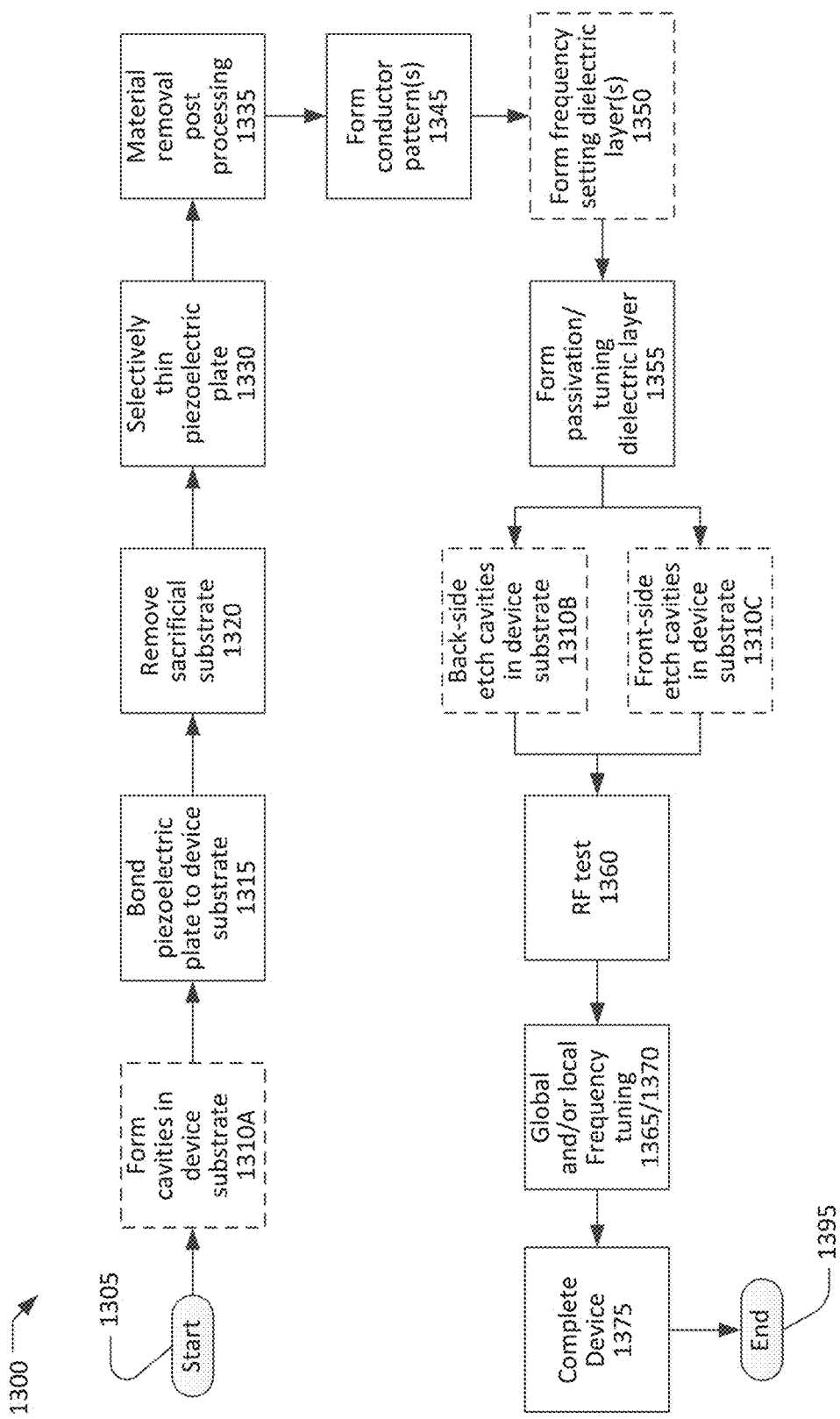
FIG. 13 is a flow chart of a process for fabricating a filter.

FIG. 13 is a simplified flow chart showing a process 1300 for fabricating a filter device incorporating XBARs. Specifically, the process 1300 is for fabricating a filter device using a frequency setting dielectric layer over some resonators as shown in FIG. 6A and multiple diaphragm thicknesses as shown in FIG. 6B and FIG. 9. The process 1300 starts at 1305 with a device substrate and a thin plate of piezoelectric material disposed on a sacrificial substrate. The process 1300 ends at 1395 with a completed filter device. The flow chart of FIG. 13 includes only major process steps. Various conventional process steps (e.g. surface preparation, cleaning, inspection, baking, annealing, monitoring, testing, etc.) may be performed before, between, after, and during the steps shown in FIG. 13.

While FIG. 13 generally describes a process for fabricating a single filter device, multiple filter devices may be fabricated simultaneously on a common wafer (consisting of a piezoelectric plate bonded to a substrate). In this case, each step of the process 1300 may be performed concurrently on all of the filter devices on the wafer.

The flow chart of FIG. 13 captures three variations of the process 1300 for making an XBAR which differ in when and how cavities are formed in the device substrate. The cavities may be formed at steps 1310A, 1310B, or 1310C. Only one of these steps is performed in each of the three variations of the process 1300.

The piezoelectric plate may be, for example, lithium niobate or lithium tantalate, either of which may be Z-cut, rotated Z-cut, or rotated YX-cut. The piezoelectric plate may be some other material and/or some other cut. The device substrate may preferably be silicon. The device substrate may be some other material that allows formation of deep cavities by etching or other processing.

In one variation of the process 1300, one or more cavities are formed in the device substrate at 1310A, before the piezoelectric plate is bonded to the substrate at 1315. A separate cavity may be formed for each resonator in a filter device. The one or more cavities may be formed using conventional photolithographic and etching techniques. Typically, the cavities formed at 1310A will not penetrate through the device substrate, and the resulting resonator devices will have a cross-section as shown in FIG. 3.

At 1315, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 1320, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 1320, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

Thin plates of single-crystal piezoelectric materials laminated to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. When the substrate is silicon, a layer of $SiO_2$ may be disposed between the piezoelectric plate and the substrate. When a commercially available piezoelectric plate/device substrate laminate is used, steps 1310A, 1315, and 1320 of the process 1300 are not performed.

At 1330, selected areas of the piezoelectric plate are thinned. For example, areas of the piezoelectric plate that will become the diaphragms of series resonators may be thinned as shown in FIG. 12. The thinning may be done using a scanning material tool such as an ion mill. Alternatively, the areas to be thinned may be defined by a mask and material may be removed using an ion mill, a sputter etching tool, or a wet or dry etching process. In all cases, precise control of the depth of the material removed over the surface of a wafer is required. After thinning, the piezoelectric plate will be divided into regions having two or more different thicknesses.

The surface remaining after material is removed from the piezoelectric plate may be damaged, particularly if an ion mill or sputter etch tool is used at 1330. Some form of post processing, such as annealing or other thermal process may be performed at 1335 to repair the damaged surface.

After the piezoelectric plate is selectively thinned at 1330 and any surface damage is repaired at 1335, a first conductor pattern, including IDTs of each XBAR, is formed at 1345 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 1345 by depositing the conductor layer and, optionally, one or more metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 1345 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1350, one or more frequency setting dielectric layer(s) may be formed by depositing one or more layers of dielectric material on the front side of the piezoelectric plate. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only selected resonators.

At 1355, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 1300, the passivation/tuning dielectric layer may be formed after the cavities in the device substrate are etched at either 1310B or 1310C.

In a second variation of the process 1300, one or more cavities are formed in the back side of the device substrate at 1310B. A separate cavity may be formed for each resonator in a filter device. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 1300, one or more cavities in the form of recesses in the device substrate may be formed at 1310C by etching the substrate using an etchant introduced through openings in the piezoelectric plate. A separate cavity may be formed for each resonator in a filter device. The one or more cavities formed at 1310C will not penetrate through the device substrate, and the resulting resonator devices will have a cross-section as shown in FIG. 3.

Ideally, after the cavities are formed at 1310B or 1310C, most or all of the filter devices on a wafer will meet a set of performance requirements. However, normal process tolerances will result in variations in parameters such as the thicknesses of dielectric layer formed at 1350 and 1355, variations in the thickness and line widths of conductors and IDT fingers formed at 1345, and variations in the thickness of the PZT plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 1355. The frequency of a filter device passband can be lowered by adding material to the passivation/tuning layer, and the frequency of the filter device passband can be increased by removing material to the passivation/tuning layer. Typically, the process 1300 is biased to produce filter devices with passbands that are initially lower than a required frequency range but can be tuned to the desired frequency range by removing material from the surface of the passivation/tuning layer.

At 1360, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 1365, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 1360 may be processed to generate a global contour map indicating the amount of material to be removed as a function of two-dimensional position on the wafer. The material is then removed in accordance with the contour map using the selective material removal tool.

At 1370, local frequency tuning may be performed in addition to, or instead of, the global frequency tuning performed at 1365. "Local" frequency tuning is performed with a spatial resolution smaller than an individual filter device. The test results from 1360 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 1365 and/or 1370, the filter device is completed at 1375. Actions that may occur at 1375 include forming bonding pads or solder bumps or other means for making connection between the device and external circuitry (if such pads were not formed at 1345); excising individual filter devices from a wafer containing multiple filter devices; other packaging steps; and additional testing. After each filter device is completed, the process ends at 1395.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device, comprising:
   a substrate having a surface;
   a single-crystal piezoelectric plate having front and back surfaces, the back surface attached to the surface of the substrate, portions of the single-crystal piezoelectric plate forming a plurality of diaphragms spanning respective cavities in the substrate; and
   a conductor pattern formed on the front surface, the conductor pattern defining a low band filter including one or more low band shunt resonators and one or more low band series resonators and a high band filter including one or more high band shunt resonators and one or more high band series resonators, wherein
   interleaved fingers of interdigital transducers (IDTs) of the one or more low band shunt resonators are disposed on respective diaphragms having a first thickness ts1,
   interleaved fingers of IDTs of the one or more high band series resonators are disposed on respective diaphragms having a second thickness ts2 less than ts1, and
   interleaved fingers of IDTs of the one or more low band series resonators and the one or more high band shunt resonators are disposed on respective diaphragms having other thicknesses intermediate ts1 and ts2.

2. The filter device of claim 1, wherein
   interleaved fingers of IDTs of the one or more low band series resonators and the one or more high band shunt resonators are disposed on respective diaphragms having a third thickness ts3 intermediate ts1 and ts2.

3. The filter device of claim 1, wherein the single-crystal piezoelectric plate and all of the IDTs are configured such that a respective radio frequency signal applied to each IDT excites a respective shear primary acoustic mode within the respective diaphragm.

4. The filter device of claim 3, wherein a direction of acoustic energy flow of all of the shear primary acoustic modes is substantially orthogonal to the front and back surfaces of the respective diaphragms.

5. The filter device of claim 3, wherein the single-crystal piezoelectric plate is one of lithium niobate and lithium tantalate.

6. The filter device of claim 1, the conductor pattern further defining one or more mid band filters including one or more mid band shunt resonators and one or more mid band series resonators, wherein
   interleaved fingers of IDTs of the one or more mid band series resonators and the one or more mid band shunt resonators are disposed on respective diaphragms having other thicknesses intermediate ts1 and ts2.

7. The filter device of claim 1, the conductor pattern further defining a mid band filter including one or more mid band shunt resonators and one or more mid band series resonators, wherein
   interleaved fingers of IDTs of the one or more low band series resonators and the one or more mid band shunt resonators are disposed on respective diaphragms having a third thickness ts3,
   interleaved fingers of the IDTs of the one or more mid band series resonators and the one or more high band shunt resonators are disposed on respective diaphragms having a fourth thickness ts4, and
   ts1>ts3>ts4>ts2.

8. The filter device of claim 1, wherein
   the low band filter is a band n77 bandpass filter, and
   the high band filter is a band n79 bandpass filter.

9. A method of fabricating a filter device, comprising:
   attaching a back surface of a piezoelectric plate having opposing front and back surfaces and a first thickness ts1 to a surface of a substrate;
   selectively thinning portions of the piezoelectric plate from the first thickness ts1 to a second thickness ts2 less than the first thickness;
   selectively thinning additional portions of the piezoelectric plate from the first thickness to one or more additional thicknesses intermediate ts1 and ts2;
   forming cavities in the substrate such that portions of the single-crystal piezoelectric plate form a plurality of diaphragms spanning respective cavities; and
   forming a conductor pattern on the front surface, the conductor pattern defining a low band filter including one or more low band shunt resonators and one or more low band series resonators and a high band filter including one or more high band shunt resonators and one or more high band series resonators, wherein
   interleaved fingers of interdigital transducers (IDTs) of the one or more low band shunt resonators are disposed on respective diaphragms having the first thickness ts1,
   interleaved fingers of IDTs of the one or more high band series resonators are disposed on respective diaphragms having the second thickness ts2, and
   interleaved fingers of IDTs of the one or more low band series resonators and the one or more high band shunt resonators are disposed on respective diaphragms having one of the one or more additional thicknesses intermediate ts1 and ts2.

10. The method of claim 9, wherein the one or more additional thicknesses consists of a third thickness intermediate ts1 and ts2, and interleaved fingers of IDTs of the one or more low band series resonators and the one or more high band shunt resonators are disposed on respective diaphragms having the third thickness.

11. The method of claim 9, wherein the single-crystal piezoelectric plate and all of the IDTs are configured such that a respective radio frequency signal applied to each IDT excites a respective shear primary acoustic mode within the respective diaphragm.

12. The method of claim 11, wherein a direction of acoustic energy flow of all of the shear primary acoustic modes is substantially orthogonal to the front and back surfaces of the respective diaphragms.

13. The method of claim 11, wherein the single-crystal piezoelectric plate is one of lithium niobate and lithium tantalate.

14. The method of claim 9, the conductor pattern further defining one or more mid band filters including one or more mid band shunt resonators and one or more mid band series resonators, wherein interleaved fingers of IDTs of the one or more mid band series resonators and the one or more mid band shunt resonators are disposed on respective diaphragms having other thicknesses intermediate ts1 and ts2.

15. The method of claim 9, the conductor pattern further defining a mid band filter including one or more mid band shunt resonators and one or more mid band series resonators, wherein interleaved fingers of IDTs of the one or more low band series resonators and the one or more mid band shunt resonators are disposed on respective diaphragms having a third thickness ts3, interleaved fingers of the IDTs of the one or more mid band series resonators and the one or more high band shunt resonators are disposed on respective diaphragms having a fourth thickness ts4, and ts1>ts3>ts4>ts2.

16. The method of claim 9, wherein the low band filter is a band n77 bandpass filter, and the high band filter is a band n79 bandpass filter.

* * * * *